United States Patent [19]

Graham et al.

[11] Patent Number: 4,721,682
[45] Date of Patent: Jan. 26, 1988

[54] ISOLATION AND SUBSTRATE CONNECTION FOR A BIPOLAR INTEGRATED CIRCUIT

[75] Inventors: Scott O. Graham; Lawrence Y. Lin, both of Cupertino; Hua T. Chua, Los Altos Hills, all of Calif.

[73] Assignee: Monolithic Memories, Inc., Santa Clara, Calif.

[21] Appl. No.: 780,062

[22] Filed: Sep. 25, 1985

[51] Int. Cl.[4] ............... H01L 21/22; H01L 21/20; H01L 21/26
[52] U.S. Cl. ...................... 437/33; 437/31; 437/63; 357/34; 357/50
[58] Field of Search ............ 357/34, 35, 50, 47; 148/DIG. 11, 1.5, 187; 29/571, 576 B, 576 W, 576 E

[56] References Cited

U.S. PATENT DOCUMENTS

| | | | |
|---|---|---|---|
| 3,648,125 | 3/1972 | Peltzer | 317/235 |
| 4,135,954 | 1/1979 | Chang et al. | 148/187 |
| 4,140,558 | 2/1979 | Murphy et al. | 148/175 |
| 4,256,514 | 3/1981 | Pogge | 148/1.5 |
| 4,269,636 | 5/1981 | Rivoli et al. | 148/175 |
| 4,343,080 | 8/1982 | Hataishi et al. | 29/571 |
| 4,372,030 | 2/1983 | Saitoh | 357/34 |
| 4,376,664 | 3/1983 | Hataishi et al. | 148/187 |
| 4,408,387 | 10/1983 | Kiriseko | 29/576 E |
| 4,454,646 | 6/1984 | Joy et al. | 29/576 |
| 4,454,647 | 6/1984 | Joy et al. | 29/576 |
| 4,486,942 | 12/1984 | Hirao | 29/576 W |
| 4,536,945 | 8/1985 | Gray et al. | 357/34 |
| 4,590,666 | 5/1986 | Goto | 29/576 B |
| 4,624,046 | 11/1986 | Shideler et al. | 357/34 |

OTHER PUBLICATIONS

*J. Electrochem. Soc.:Solid-State Science and Technology*, vol. 123, No. 11, pp. 1729–1737, "Topology of Silicon Structure with Recessed $SiO_2$" by E. Bassous et al.

*Primary Examiner*—Brian E. Hearn
*Assistant Examiner*—Chi-Tso Huang
*Attorney, Agent, or Firm*—Kenneth E. Leeds; Alan H. MacPherson; Paul J. Winters

[57] ABSTRACT

A structure for isolating a bipolar transistor (100) from an adjacent transistor includes a first silicon dioxide isolation region (110) laterally surrounding the transistor and a conductive channel stop region (112) laterally surrounding the silicon dioxide isolation region. The channel stop region allows electrical potential of the substrate (102) to be controlled and the silicon dioxide isolation region prevents the channel stop from contacting the transistor.

5 Claims, 3 Drawing Figures

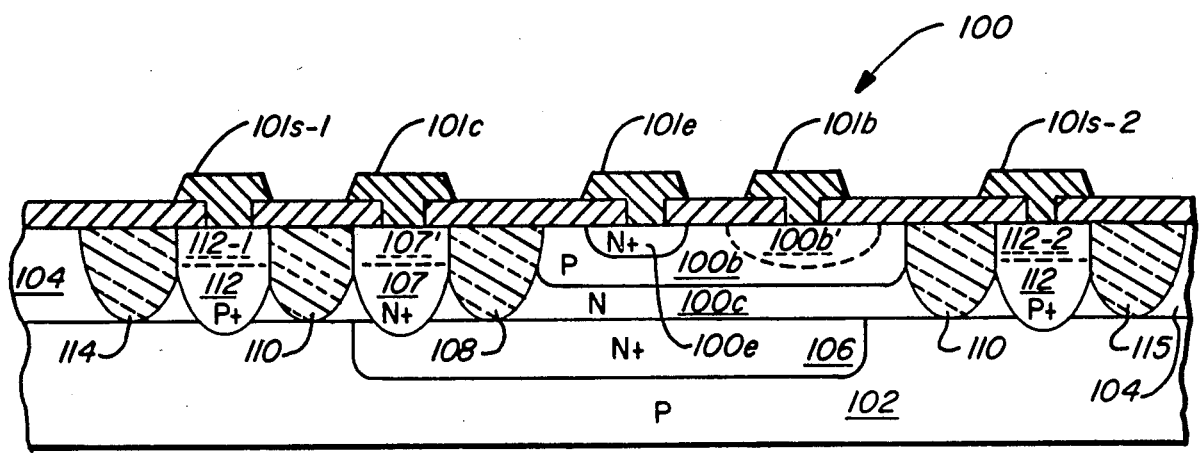
FIG._1a
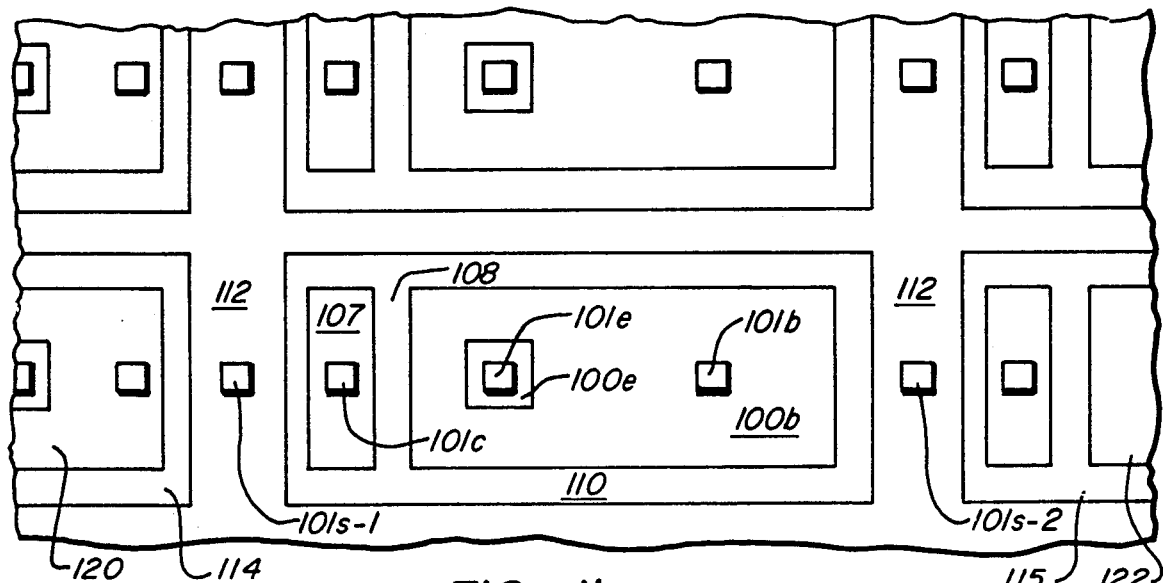
FIG._1b
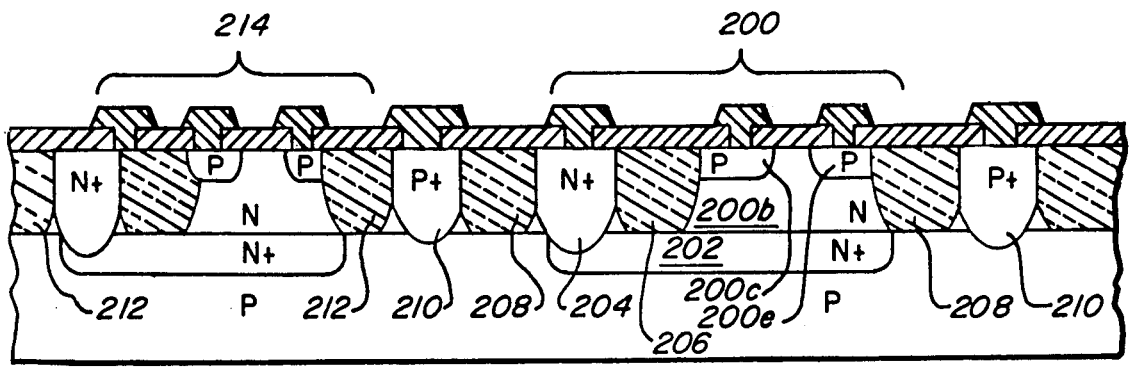
FIG._2

ISOLATION AND SUBSTRATE CONNECTION FOR A BIPOLAR INTEGRATED CIRCUIT

BACKGROUND OF THE INVENTION

This invention relates to integrated circuits and more specifically to isolation regions surrounding transistors in a bipolar integrated circuit. This invention also relates to contacts for grounding the substrate of an integrated circuit.

It is known in the art to provide a plurality of bipolar transistors in an integrated circuit and to electrically isolate the transistors so that the operation of one transistor does not interfere with the operation of another transistor. In one prior art structure, a vertical NPN transistor is formed in an epitaxial layer of one conductivity type which in turn is formed on a substrate of the opposite conductivity type. The NPN transistor is laterally surrounded by a P+ region which extends from the surface of the epitaxial layer to an underlying laterally extending PN isolation junction formed between the substrate and the epitaxial layer. This P+ region isolates the NPN transistor from other devices formed within the epitaxial layer. Such a structure is illustrated as prior art in FIGS. 1 and 2 of U.S. Pat. No. 3,648,125, issued to Douglas Peltzer, and incorporated herein by reference. Unfortunately, the P+ isolation region of Peltzer FIGS. 1 and 2 contacts and forms a capacitive PN junction with the collector region of the transistor. The capacitance of this junction degrades the speed of the transistor.

It is also known in the art to isolate a transistor by laterally surrounding the transistor with a silicon dioxide isolation region which extends from the surface of the epitaxial layer to the underlying laterally extending PN isolation junction. Such an isolation structure is disclosed in the Peltzer patent (e.g. Peltzer FIG. 4). It is also known to provide a doped channel stop region under the silicon dioxide isolation region discussed by Peltzer to further isolate adjacent transistors. Unfortunately, this structure does not allow for good electrical contact from the top side to the underlying substrate adjacent to the transistor. Because of this, it is generally necessary for the transistor buried layer to extend beneath the inner edge of the silicon dioxide isolation region to prevent substrate injection current from the transistor collector. This is particularly true in applications in which the transistors are driven into saturation and are sensitive to increases in substrate voltage. (Although Peltzer FIGS. 5 and 6 illustrate a buried layer that does not extend beneath the entire inner edge of the silicon dioxide isolation regions, in such a structure it is usually necessary to use other means for limiting substrate current injection, provide an added substrate contact structure adjacent to the transistor, use the transistor in a substrate voltage insensitive application, or provide a relatively large space between the transistors.) Because the buried layers must generally extend beneath and be in contact with the silicon dioxide isolation regions but be spaced far enough apart so as to avoid contacting the aforementioned channel stop region, this isolation structure consumes a relatively large surface area.

U.S. Pats. Nos. 4,454,646 and 4,454,647 issued to Joy et al. discuss an isolation structure in which a silicon dioxide isolation region laterally surrounds a transistor. The silicon dioxide isolation region extends from the surface of the epitaxial layer to the substrate. Portions of the silicon dioxide isolation region include openings which are filled with P+ type polycrystalline silicon. These P+ regions are used to ground the substrate adjacent to the transistor. Unfortunately, the process used to build this structure is quite complicated.

SUMMARY

A transistor constructed in accordance with the present invention is laterally surrounded by a silicon dioxide isolation region extending from the surface of the semiconductor material to a laterally extending PN isolation junction. A channel stop region likewise extends from the surface of the semiconductor material to the laterally extending PN junction and laterally surrounds the silicon dioxide isolation region. The channel stop region provides an electrical contact to the semiconductor material subjacent to the laterally extending PN junction.

In one embodiment, the semiconductor material subjacent to the laterally extending PN isolation junction is in general a substrate and the semiconductor material above this PN junction is in general an epitaxial layer. (However, because of diffusion of dopants during manufacturing between the substrate and epitaxial layer, the PN isolation junction can be displaced from the interface between the substrate and epitaxial layer.) A buried layer is typically formed at the interface between the substrate and the epitaxial layer.

Of importance, the structure of the present invention takes up a small surface area, but provides an efficient electrical contact to the substrate. The invented structure is made with a simpler process than the process discussed in the Joy patents.

BRIEF DESCRIPTION OF THE DRAWINGS

FIG. 1a illustrates in cross section a vertical bipolar transistor isolation structure constructed in accordance with the present invention.

FIG. 1b illustrates in plan view the structure of FIG. 1a.

FIG. 2 illustrates in cross section a lateral PNP transistor with an isolation structure constructed in accordance with the present invention.

DETAILED DESCRIPTION

FIG. 1a illustrates in cross section a transistor 100 and an isolation structure constructed in accordance with the present invention. It is noted, however, that transistor 100 is generally a single device in an integrated circuit including a number of other devices. Only a small portion of the integrated circuit is illustrated for simplicity.

Referring to FIG. 1a, transistor 100 includes a P type base region 100b, an N+ emitter region 100e and an N type collector region 100c. (Although transistor 100 is a vertical NPN transistor, the principles described herein apply to both PNP and NPN transistors and to lateral and vertical transistors.) Collector region 100c is coupled to a collector contact 101c via an N+ buried layer 106 (formed under transistor 100) and an N+ collector sinker region 107. A silicon dioxide isolation region 108 separates N+ collector sinker region 107 from base 100b, thus preventing a capacitive PN junction from forming between N+ sinker region 107 and P type base 100b, which would otherwise degrade the speed of transistor 100. (In other embodiments, silicon dioxide isolation region 108 is not formed and a PN junction exists between N+ sinker region 107 and P type base region 100b).

The structure of FIG. 1a includes a P type substrate 102 and an N type epitaxial layer 104. Laterally surrounding transistor 100 is a silicon dioxide isolation region 110 which extends from the surface of epitaxial layer 104 to the laterally extending PN junction between epitaxial layer 104 and substrate 102. Laterally surrounding silicon dioxide isolation region 110 is a P+ channel stop region 112. Adjacent to P+ channel stop region 112 is a second silicon dioxide isolation region 114 which laterally surrounds an adjacent transistor 120 (partially illustrated in FIG. 1b). Also, adjacent to P+ channel stop region 112 is a third silicon dioxide isolation region 115 which surrounds another adjacent transistor 122 (also partially illustrated in FIG. 1b).

Channel stop region 112 is coupled to a desired electrical potential via contacts 101s-1 and 101s-2 (FIG. 1a) and also electrically contacts P type substrate 102. Thus, region 112 serves as both a channel stop and as an electrically conductive contact to substrate 102 adjacent to transistor 100. Therefore, P+ channel stop region 112 is used to hold substrate 102 at a desired electrical potential. In one embodiment, region 112 is used to ground substrate 102. Because substrate 102 is grounded directly adjacent to transistor 100, leakage current from collector 100c into substrate 102 (substrate injection current from a parasitic PNP transistor) will not raise the voltage of substrate 102 appreciably. Therefore, buried layer 106 need not extend underneath silicon dioxide isolation region 110. Thus, the transistor of FIG. 1a can be constructed using a relatively small surface area.

It is noted that P+ channel stop region 112 includes portions of 112-1 and 112-2 having an enhanced dopant concentration. Similarly, collector sinker region 107 and base 100b include portions 107' and 100b', respectively, having enhanced dopant concentrations. Portions 112-1, 112-2, 107' and 100b' faciliatate electrical connection to contacts 101s-1, 101s-2, 101c and 101b, respectively.

FIG. 1b illustrates in plan view transistor 100. (Portions 112-1, 112-2, 107' and 100b' are not shown in FIG. 1b to simplify the illustration.) As can be seen in FIG. 1b, transistor 100 is laterally surrounded by silicon dioxide isolation region 110, which in turn is laterally surrounded by P+ channel stop region 112. Adjacent to channel stop region 112 are transistors 120 and 122, which are laterally surrounded by silicon dioxide isolation regions 114 and 115, respectively.

A process for manufacturing transistor 100, surrounding silicon dioxide isolation region 110 and P+ channel stop region 112 is as follows:

1. Mask P type substrate 102 and dope with N type impurities to form buried layer 106.

2. Remove the mask. Form N type epitaxial layer 104 on substrate 102.

3. Cover epitaxial layer 104 with a silicon nitride mask (formed on a thin silicon dioxide layer). Pattern the silicon nitride mask to define where silicon dioxide isolation regions 108, 110, 114 and 115 are to be formed, leaving masked the to-be-formed active regions as well as the portions of epitaxial layer 104 where P+ region 112 is to be formed.

4. Partially etch the exposed portions of epitaxial layer 104 to form grooves and oxidize the exposed portions to form silicon dioxide isolation regions 108, 110, 114 and 115, the surfaces of which are substantially co-planar with the top surface of semiconductor material.

5. Remove the silicon nitride mask.

6. Mask epitaxial layer 104 and implant N type dopants to form N+ collector sinker region 107. Then remove the collector sinker mask.

7. Mask epitaxial layer 104 and implant dopants to form P+ channel stop region 112. Dope the exposed portion of epitaxial layer 104. Remove the mask.

8. Remove the thin silicon dioxide layer and grow a new silicon dioxide layer on epitaxial layer 104.

9. Mask epitaxial layer 104 and implant dopants to form base region 100b. Remove the base mask.

10. Mask epitaxial layer 104 and implant dopants to form regions 100b', 112-1 and 112-2. Remove the mask.

11. Etch contact holes in the silicon dioxide layer above epitaxial layer 104.

12. Mask epitaxial layer 104 and implant dopants to form emitter region 100e and region 107'. Remove the mask.

13. Form a metal layer on the silicon dioxide and etch the metal to form contacts 101s-1, 101s-2, 101c, 101e and 101b.

FIG. 2 illustrates in cross section a lateral PNP transistor 200 with an isolation structure constructed in accordane with our invention. Transistor 200 includes a collector region 200c, a base region 200b and an emitter region 200e. Beneath transistor 200 is buried layer 202 which electrically contacts base region 200b. An N+ sinker region 204 electrically contacts buried layer 202. A silicon dioxide isolation region 206 prevents collector region 200c from contacting and forming a capacitive PN junction with N+ sinker region 204, which would otherwise degrade the speed of transistor 200. Transistor 200 is laterally surrounded by silicon dioxide isolation region 208, which in turn is surrounded by P+ channel stop region 210. Adjacent to P+ channel stop region 210 is a silicon dioxide isolation region 212 which laterally surrounds an adjacent transistor 214. Transistors 200 and 214, channel stop region 210 and silicon dioxide regions 208 and 212 are formed using a process similar to the one described above, differing only in the steps used to form transistors 200 and 214. (In some embodiments, the doping in the portions where contacts are formed to regions 210 and 204 is enhanced. This enhancement is not shown in FIG. 2 to simplify the drawing.)

While the invention has been described in detail with respect to specific embodiments, those skilled in the art will recognize that changes can be made in form and detail without departing from the spirit and scope of the invention. Accordingly, all such modifications come within the scope of the present invention.

We claim:

1. A method for forming a transistor comprising:
forming an epitaxial layer of a first conductivity type on a substrate of a second conductivity type opposite to said first conductivity type;
forming a transistor in said epitaxial layer;
forming a nonconductive region laterally surrounding said transistor, said nonconductive region extending from the surface of said epitaxial layer to said substrate; and
doping a portion of said epitaxial layer so that said doped portion is of said second conductivity type, said doped portion contacting said subtrate, said doped portion of said epitaxial layer laterally surrounding said nonconductive region.

2. A method comprising the steps of:

forming an epitaxial layer of semiconductor material of a first conductivity type on a substrate of a second conductivity type opposite of said first conductivity type;

forming a plurality of transistors in said epitaxial layer;

forming a plurality of nonconductive regions, each nonconductive region within said plurality laterally surrounding an associated one of said transistors within said plurality of transistors, each of said nonconductive regions within said plurality of nonconductive regions being laterally surrounded by a portion of said epitaxial layer; and doping the portions of said epitaxial layer laterally surrounding said nonconductive regions within said plurality of nonconductive regions so that said portions of said epitaxial layer are of said second conductivity type and said portions electrically contact said substrate.

3. A method comprising the steps of:

forming a first region of semiconductor material having a first conductivity type above a second region of semiconductor material having a second conductivity type opposite to said first conductivity type, said first region having a top surface;

forming a transistor in said first region of semiconductor material;

forming a nonconductive region laterally surrounding said transistor, said nonconductive region extending from said top surface of said first region to said second region; and doping a portion of said first region so that said doped portion is of said second conductivity type, said doped portion contacting said second region, said doped portion of said first region laterally surrounding said nonconductive region.

4. A process comprising the steps of:

providing a first region of semiconductor material above a second region of semiconductor material, said second region having a first conductivity type, said first region having a top surface;

forming a transistor in a first portion of said first region;

forming a nonconductive region laterally surrounding said transistor, said nonconductive region extending from said top surface to said second region;

and wherein at the conclusion of said process, said nonconductive region is laterally surrounded by a second portion of said first region, said second portion extending to said second region, said second portion having said first conductivity type, and wherein at the conclusion of said process, the part of said first portion of said first region adjacent to said second region has a second conductivity type opposite said first conductivity type.

5. The method of claim 4 further comprising the step of forming electrically conductive material on said second portion of said first region, said electrically conductive material electrically contacting said second portion of said first region, said second portion of said first region electrically contacting said second region, so that said electrically conductive material permits a selected electrical potential to be applied to said second region.

* * * * *